United States Patent
Wang et al.

(10) Patent No.: US 10,586,736 B2
(45) Date of Patent: Mar. 10, 2020

(54) HYBRID FIN CUT WITH IMPROVED FIN PROFILES

(71) Applicant: GLOBALFOUNDRIES INC., Grand Cayman (KY)

(72) Inventors: Haiting Wang, Clifton Park, NY (US); Ruilong Xie, Niskayuna, NY (US); Shesh Mani Pandey, Saratoga Springs, NY (US); Hui Zang, Guilderland, NY (US); Garo Jacques Derderian, Saratoga Springs, NY (US); Scott Beasor, Greenwich, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/005,073

(22) Filed: Jun. 11, 2018

(65) Prior Publication Data

US 2019/0378763 A1    Dec. 12, 2019

(51) Int. Cl.
| | |
|---|---|
| *H01L 21/8234* | (2006.01) |
| *H01L 29/66* | (2006.01) |
| *H01L 27/088* | (2006.01) |
| *H01L 27/02* | (2006.01) |
| *H01L 21/308* | (2006.01) |
| *H01L 21/762* | (2006.01) |

(52) U.S. Cl.
CPC .. *H01L 21/823481* (2013.01); *H01L 21/3086* (2013.01); *H01L 21/76224* (2013.01); *H01L 21/823431* (2013.01); *H01L 27/0207* (2013.01); *H01L 27/0886* (2013.01); *H01L 29/6681* (2013.01)

(58) Field of Classification Search
None
See application file for complete search history.

(56) References Cited

U.S. PATENT DOCUMENTS

| | | | |
|---|---|---|---|
| 9,245,883 B1 | 1/2016 | Lin et al. | |
| 9,418,994 B1* | 8/2016 | Chao | H01L 27/0886 |
| 9,607,985 B1* | 3/2017 | Tseng | H01L 27/0886 |
| 10,147,805 B2* | 12/2018 | Chen | H01L 29/6681 |
| 2015/0206759 A1* | 7/2015 | Tsao | H01L 29/0653 |
| | | | 257/506 |
| 2016/0093502 A1* | 3/2016 | Cheng | H01L 21/3086 |
| | | | 257/623 |
| 2016/0111336 A1 | 4/2016 | Chang et al. | |
| 2017/0033194 A1* | 2/2017 | Chen | H01L 29/6681 |

* cited by examiner

*Primary Examiner* — J. E. Schoenholtz
(74) *Attorney, Agent, or Firm* — Francois PagettE; Andrew M. Calderon; Roberts Mlotkowski Safran Cole & Calderon, P.C.

(57) ABSTRACT

The present disclosure relates to semiconductor structures and, more particularly, to a hybrid fin cut with improved fin profiles and methods of manufacture. The structure includes: a plurality of fin structures in a first region of a first density of fin structures; a plurality of fin structures in a second region of a second density of fin structures; and a plurality of fin structures in a third region of a third density of fin structures. The first density, second density and third density of fin structures are different densities of fin structures, and the plurality of fin structures in the first region, the second region and the third region have a substantially uniform profile.

19 Claims, 10 Drawing Sheets

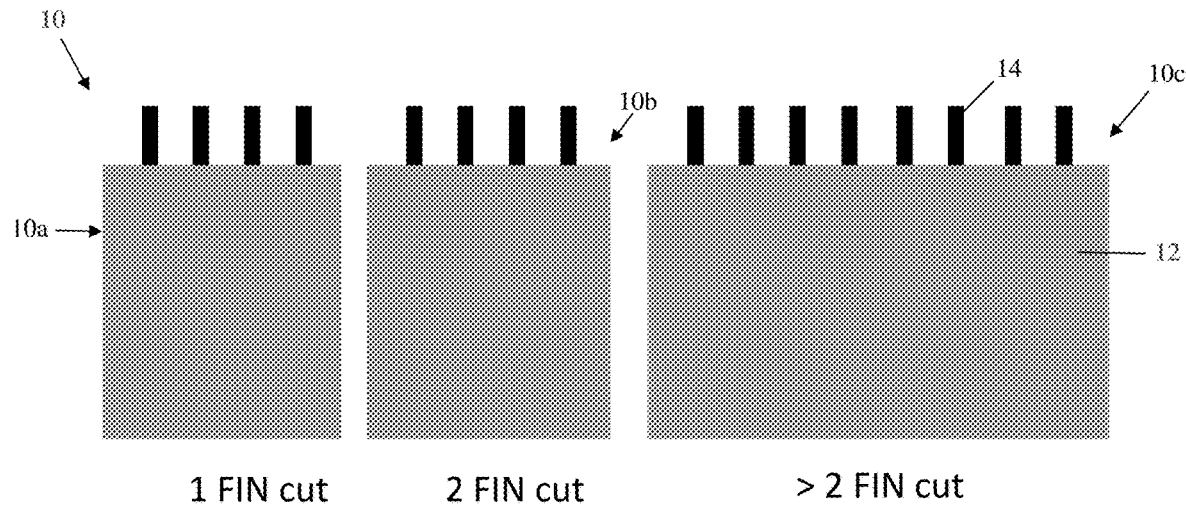
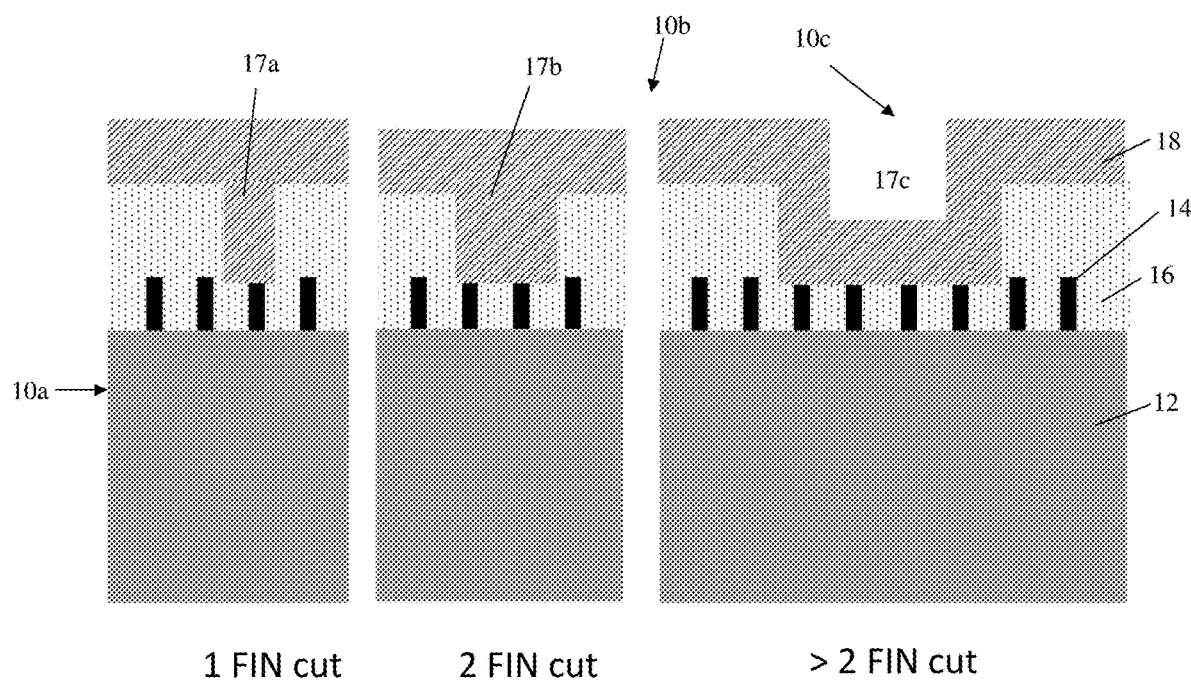

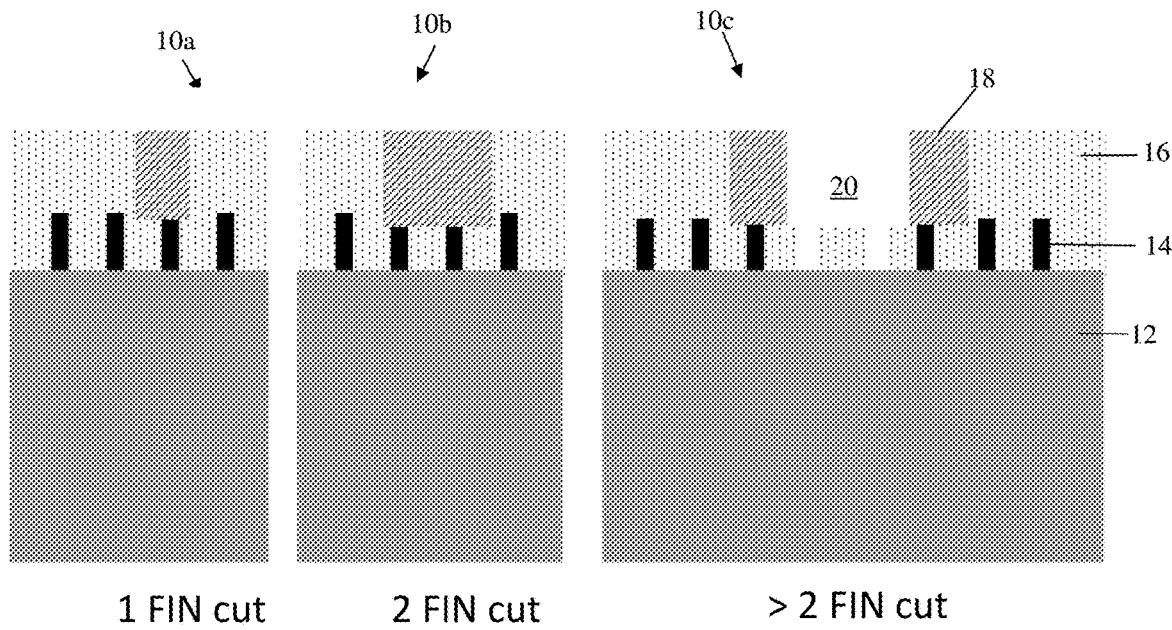
1 FIN cut  
FIG. 3A
2 FIN cut  
FIG. 3B
> 2 FIN cut  
FIG. 3C
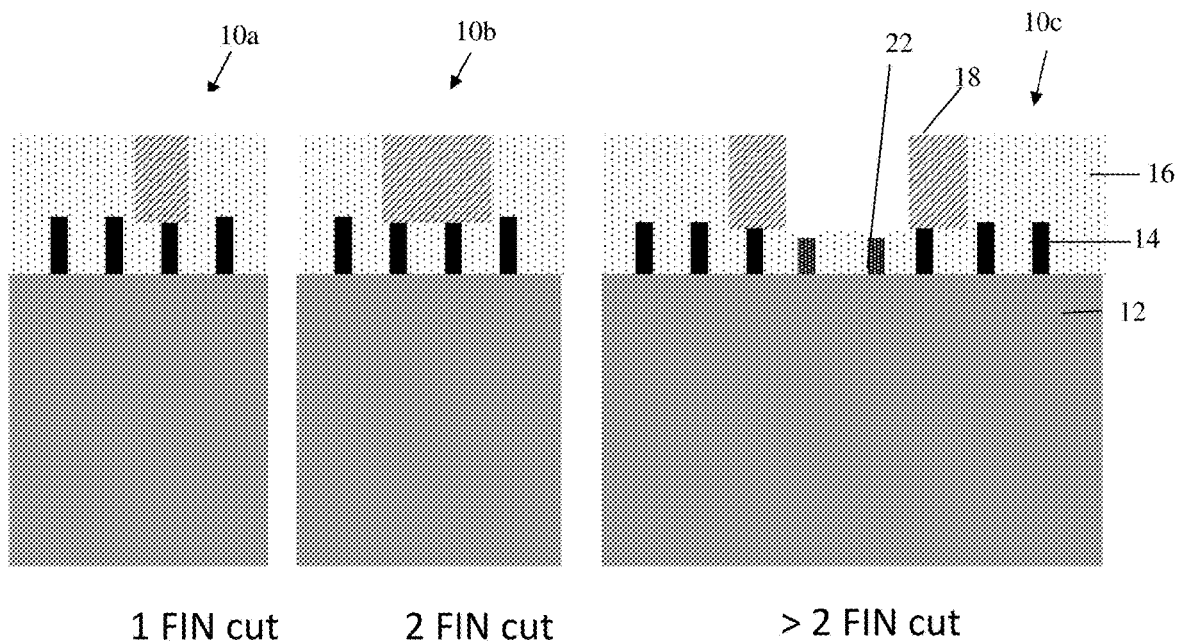
1 FIN cut  
FIG. 4A
2 FIN cut  
FIG. 4B
> 2 FIN cut  
FIG. 4C 1 FIN cut  2 FIN cut  > 2 FIN cut 1 FIN cut  2 FIN cut  > 2 FIN cut

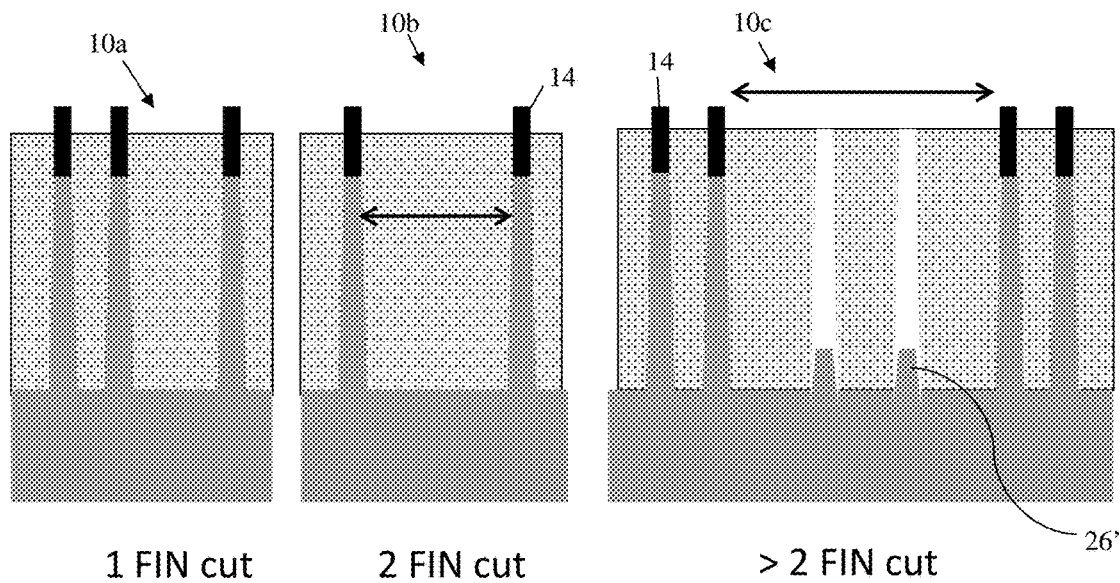
1 FIN cut
FIG. 8D
2 FIN cut
FIG. 8E
> 2 FIN cut
FIG. 8F
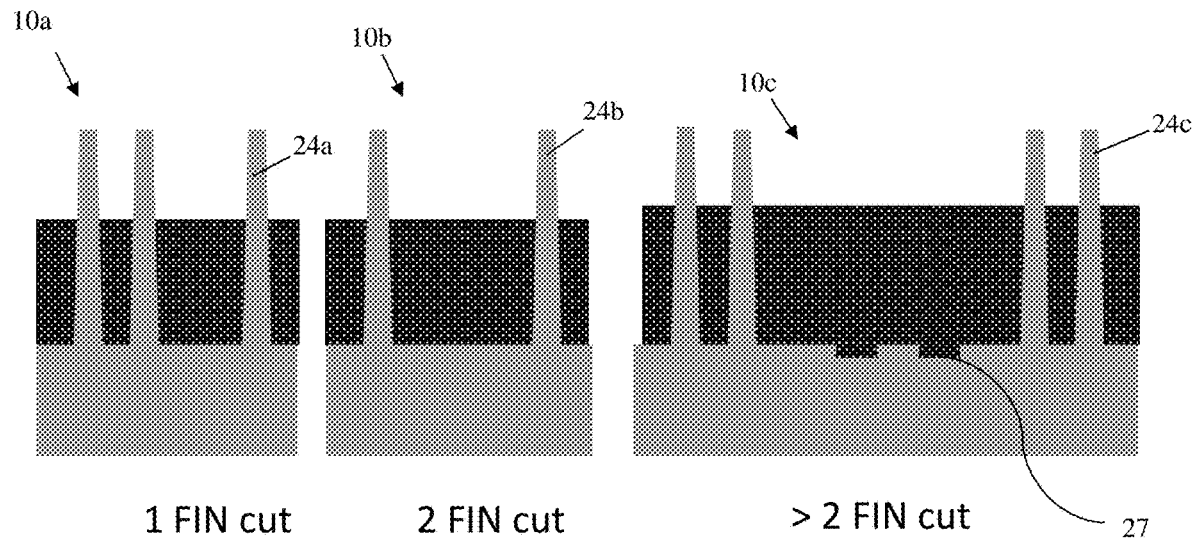
1 FIN cut
FIG. 9A
2 FIN cut
FIG. 9B
> 2 FIN cut
FIG. 9C

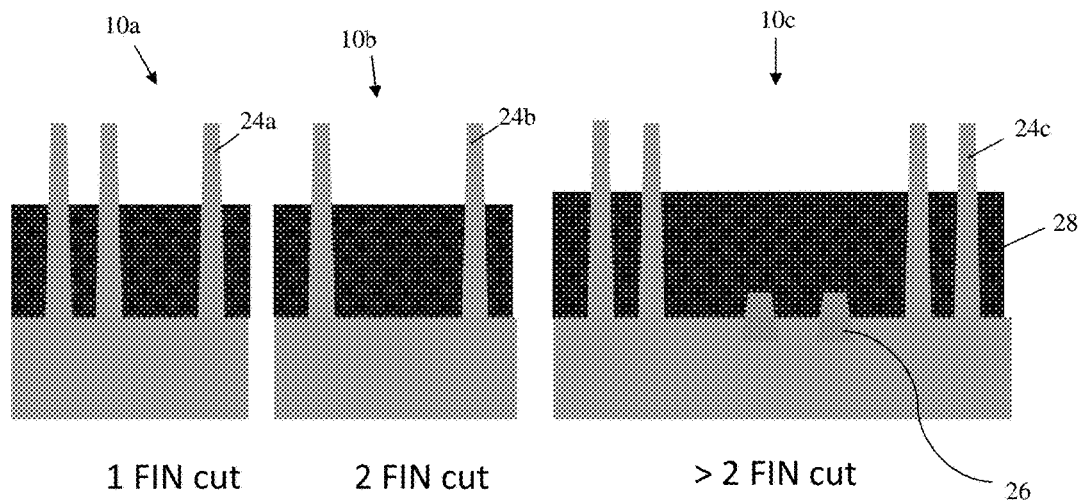
1 FIN cut  
FIG. 9D
2 FIN cut  
FIG. 9E
> 2 FIN cut  
FIG. 9F
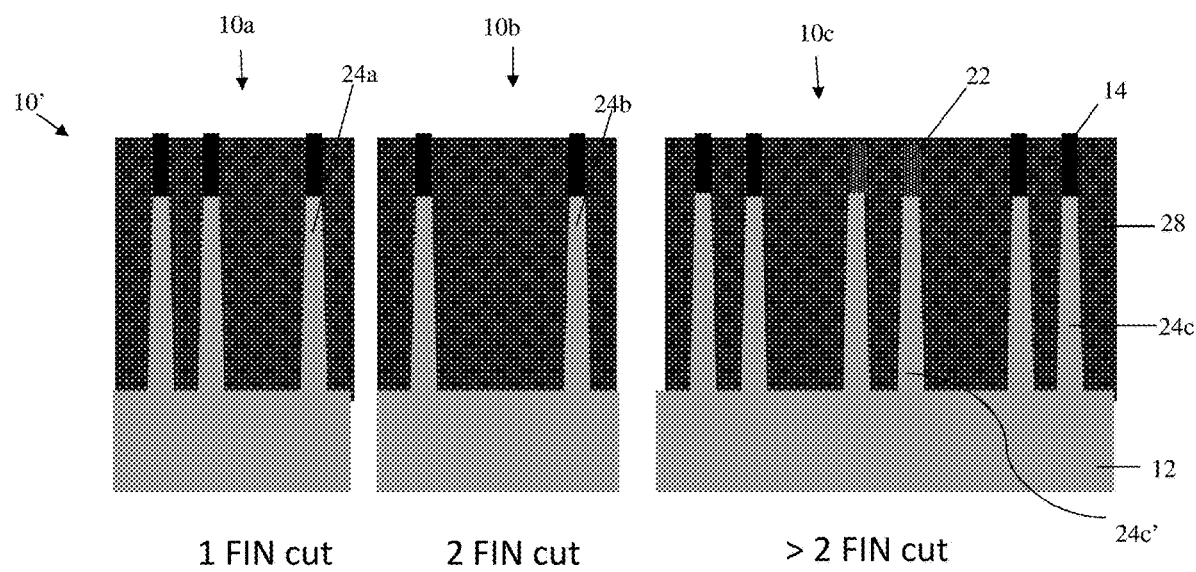
1 FIN cut  
FIG. 10A
2 FIN cut  
FIG. 10B
> 2 FIN cut  
FIG. 10C 1 FIN cut  2 FIN cut  > 2 FIN cut 1 FIN cut  2 FIN cut  > 2 FIN cut 1 FIN cut     2 FIN cut     > 2 FIN cut 1 FIN cut     2 FIN cut     > 2 FIN cut 1 FIN cut　　　2 FIN cut　　　> 2 FIN cut 1 FIN cut　　　2 FIN cut　　　> 2 FIN cut

HYBRID FIN CUT WITH IMPROVED FIN PROFILES

FIELD OF THE INVENTION

The present disclosure relates to semiconductor structures and, more particularly, to a hybrid fin cut with improved fin profiles and methods of manufacture.

BACKGROUND

By virtue of continued scaling of semiconductor technologies, each generation of technology node has become smaller with more complex circuits than the previous generation. In the course of scaling a device, functional density (i.e., the number of devices per chip area) has generally increased while geometry size (i.e., the smallest component (or line) that can be created using a fabrication process) has decreased. This scaling process generally provides benefits by increasing production efficiency and lowering associated costs; however, it can also result in complexities of the manufacturing process including alignment issues, etc.

For example, double patterning lithography (DPL) is generally used in fin field effect transistor (FinFET) fabrication processes. A conventional DPL process uses two mask patterns, a mandrel pattern and a cut pattern that removes unwanted portions of the mandrel pattern, a derivative, or both. For example, the DPL process forms a fin using the mandrel pattern and then cuts the fin into two or more sections using the cut pattern. A conventional fin isolation process uses another patterning process to form an isolation structure between two adjacent fins.

Various issues arise from these conventional processes. For example, formation of fins in different density regions may result in different fin profiles due to loading issues, e.g., density of the fin structures. These profile issues may lead to misalignment of structures, amongst other issues. In more specific examples, fin spacing between adjacent fins may result in different fin profiles, with an isolated side of the fin being more tapered compared to a dense fin side. By way of illustration, if only one (1) fin pitch is close to an isolated fin side (e.g., single fin cut), the taper is not obvious; however, if there are three or more fin pitch spaces close to the isolated fin side (e.g., cutting more than three (3) fins), a taper on the isolated fin side becomes very noticeable.

SUMMARY

In an aspect of the disclosure, a structure comprises: a plurality of fin structures in a first region of a first density of fin structures; a plurality of fin structures in a second region of a second density of fin structures; and a plurality of fin structures in a third region of a third density of fin structures. The first density, second density and third density of fin structures are different densities of fin structures, and the plurality of fin structures in the first region, the second region and the third region have a substantially uniform profile.

In an aspect of the disclosure, a method comprises: forming fin hardmask structures in a first region, a second region and a third region; removing selected ones of the fin hardmask structures in the first region, the second region and the third region, with remaining hardmask fin structures covering an area of active fin structure formation; forming a masking material covering an area of dummy fin structure formation in the third region; patterning active fin structures using remaining fin hardmask structures as a mask in the first region, the second region and the third region, and the dummy fin structures using the masking material in the third region; removing the dummy fin structures; and forming shallow trench isolation regions between the active fin structures.

In an aspect of the disclosure, a method comprises: forming a plurality of hardmask fin structures in a first region, a second region and a third region of a semiconductor chip; forming a first masking material over the plurality of hardmask fin structures in the first region, the second region and the third region; forming trenches in the first masking material to expose selected hardmask fin structures of the plurality of hardmask fin structures in the first region, the second region and the third region; forming a second masking material in the trenches to cover the exposed selected hardmask fin structures in the first region, the second region and the third region; partially removing the second masking material in the third region to expose adjacent hardmask fin structures of the selected hardmask fin structures in the third region; removing the exposed adjacent hardmask fin structures in the third region to form spaces; forming a third masking material in the spaces in the third region; removing the second masking material in the first region and the second region and remaining portions of the second masking material in the third region to expose the selected hardmask fin structures remaining in the first region, the second region and the third region; removing the selected hardmask fin structures which were remaining in the first region, the second region and the third region; removing the first masking material and forming fin structures in the first region, the second region and the third region corresponding to the locations which include the hardmask fin structures and the third masking material; and removing unwanted fin structures which are masked with the third material in the third region to create a region of less density compared to the first region and the second region.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 1A-1C show a structure with different fin cut spacing, amongst other features, and respective fabrication processes in accordance with aspects of the present disclosure.

FIGS. 2A-2C show a material formed over hardmask fin structures, amongst other features, and respective fabrication processes in accordance with aspects of the present disclosure.

FIGS. 3A-3C show exposed inner fin structures of hardmask material in a section of a semiconductor chip, amongst other features, and respective fabrication processes in accordance with aspects of the present disclosure.

FIGS. 4A-4C show a material deposited within trenches formed by removal of inner fin structures, amongst other features, and respective fabrication processes in accordance with aspects of the present disclosure.

FIGS. 8A-8F show an over-etch and under-etch, respectively, of removed selective fin structures, amongst other features, and respective fabrication processes in accordance with aspects of the present disclosure.

FIGS. 9A-9F show shallow trench isolation (STI) features in the structures of FIGS. 8A-8F, amongst other features, and respective fabrication processes in accordance with aspects of the present disclosure.

FIGS. 10A-13F show the formation of fin structures, amongst other features, in accordance with additional aspects of the present disclosure.

DETAILED DESCRIPTION

Figures 5A, 5B, 5C:
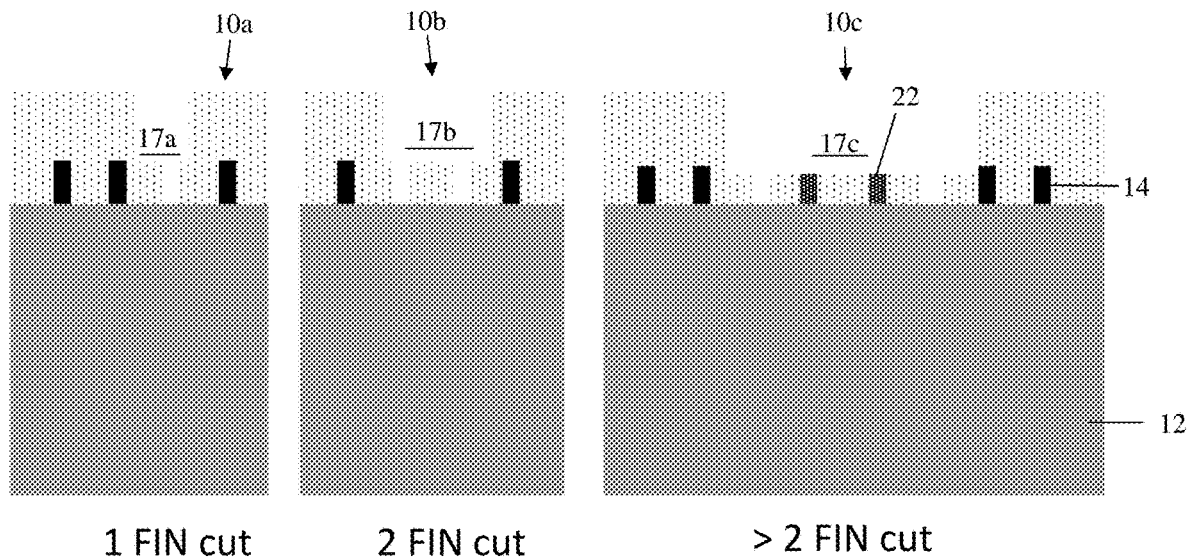
FIGS. 5A-5C show exposed underlying hardmask fin structures, amongst other features, and respective fabrication processes in accordance with aspects of the present disclosure.

The present disclosure relates to semiconductor structures and, more particularly, to a hybrid fin cut with improved fin profiles and methods of manufacture. More specifically, the present disclosure provides uniform fin profiles for fin structures adjacent to wide fin cut spaces, e.g., >2 fin cut space. That is, the present disclosure eliminates the fin etch loading effect, e.g., tapering of the fin, for fins adjacent to the wide fin cut space, e.g., >2 fin cut, by performing a novel fin cut patterning process. Accordingly the present disclosure avoids different fin profiles for fins adjacent to both a narrow cut space (dense side) and a wide cut space (isolated side).

In embodiments, the methods of manufacturing of the hybrid fin cut with improved fin profiles includes a process of record for fins having a single or double space cut (dense side fins); whereas, for fins adjacent to wider fin space cuts, dummy fins are utilized to ensure a more uniform loading (e.g., density) for fin structures adjacent in the wide fin cut spacing. For example, for fin structures adjacent to wide cut spaces (e.g., >2 fin cut), the processes described herein will use dummy fin structures to even the loading effects with the fin structures in more dense areas of the chip. In this way, the dummy fin structures will be used to provide a more uniformly dense fin array to ensure uniform loading during the etching process of all fin structures (regardless of final spacing). This uniform loading will ensure that the fin structures near the wide cut space (isolated fin side) will have a less tapered profile, e.g., a profile that matches to the fin structures adjacent to the single or double space cut. The dummy fin structures can be removed after the fin formation. In this way, there is a uniform or substantially uniform loading on all of the wanted fins.

By way of example, the fabrication flow can include, generally, the following steps: forming a fin hardmask; forming a first placeholder (e.g., oxide material) to cover at least one unwanted fin structure next to an active fin structure; forming a second placeholder (SiOC material) to cover any other unwanted fin structure (dummy fin structures); removing the first placeholder and underlying fin hardmask and performing a fin etch; and removing the second placeholder and underlying fin structures. In more specific embodiments, the process flow includes: patterning a hardmask by a self-aligned patterning process; patterning a fin cut; forming a spacer (oxide material) to block a first fin structure near a wanted fin structure; removing the unwanted fin structure and the hardmask, and filling with a new hardmask material; removing the spacer and underlying fin hardmask material; providing a final fin etch; and removing any unwanted fins under the new hardmask material.

The hybrid fin cut with improved fin profile of the present disclosure can be manufactured in a number of ways using a number of different tools. In general, though, the methodologies and tools are used to form structures with dimensions in the micrometer and nanometer scale. The methodologies, i.e., technologies, employed to manufacture the hybrid fin cut with improved fin profile of the present disclosure have been adopted from integrated circuit (IC) technology. For example, the structures are built on wafers and are realized in films of material patterned by photolithographic processes on the top of a wafer. In particular, the fabrication of the hybrid fin cut with improved fin profile uses three basic building blocks: (i) deposition of thin films of material on a substrate, (ii) applying a patterned mask on top of the films by photolithographic imaging, and (iii) etching the films selectively to the mask.

FIGS. 1A-1C show a structure with different fin cut spacing, amongst other features, and respective fabrication processes in accordance with aspects of the present disclosure. More specifically, the structure 10 includes a first section 10a which will have a single fin cut space between selected fin structures, a second section 10b which will have a two (2) fin cut space between selected fin structures and a third section 10c which will have a greater than two (2) fin cut space between selected fin structures (e.g., isolated fin structures). In embodiments, each of the sections 10a, 10b, 10c include a substrate 12 composed of any suitable semiconductor material. The substrate 12 can be composed of, e.g., Si, SiGe, SiGeC, SiC, GaAs, InAs, InP, and other III/V or II/VI compound semiconductors.

Still referring to FIGS. 1A-1C, a hardmask material is deposited and patterned on a surface of the substrate 12 to form a plurality of hardmask fin structures 14. In embodiments, the hardmask material can be a nitride material, patterned using conventional patterning techniques such as a Self-Aligned Double Patterning (SADP) process or a Self-Aligned Quadruple Patterning (SAQP) process, as examples. In embodiments, the patterning will be used form a uniform fin pitch for subsequent fin structure formation, as is detailed herein.

In FIGS. 2A-2C, a material 16 is formed over the hardmask fin structures 14. In embodiments, the material 16 can be an organic planarization layer (OPL). Following the deposition process, the organic planarization layer (OPL) 16 undergoes a patterning process in each of the sections 10a, 10b, 10c to form respective trenches 17a, 17b, 17c of different widths (e.g., fin pitches). For example, in section 10a the patterning process will form a trench 17a exposing a single pattern (fin) of the hardmask fin structures 14, whereas, in section 10b the patterning process will form a trench 17b exposing two fins of the hardmask fin structures 14. Similarly, in section 10c, the patterning process will form a trench 17c exposing more than two fins (e.g., >2 fins) of the hardmask fin structures 14.

The material 16 can be formed by a conventional deposition process, followed by lithography and etching methods known to those of skill in the art. For example, after the deposition of the material 16, a resist formed over the material 16 is exposed to energy (light) to form a pattern (opening). An etching process with a selective chemistry, e.g., reactive ion etching (RIE), will be used to form the trenches 17a, 17b, 17c through the openings of the resist. The etching process will expose selected hardmask fin structures 14 in each respective section 10a, 10b, 10c. The resist can then be removed by a conventional oxygen ashing process or other known stripants.

Following the removal of the resist, an oxide material 18 is deposited on the material 16 and within the respective trenches 17a, 17b, 17c. In embodiments, the oxide material 18 can be deposited using a low temperature oxide spacer deposition. The oxide spacer thickness is preferably chosen such that it is slightly greater than one (1) fin pitch so that the oxide spacers will pinch off (fill) the trenches 17a, 17b in the first section 10a and second section 10b, but will not completely fill the trench 17c in the third section 10c. In other words, due to the width of the trench 17c in the third section 10c (e.g., four hardmask fin structures 14), the oxide deposition will form on the sidewalls and bottom portion, without completely filling the trench 17c.

In FIGS. 3A-3C, the oxide material 18 is etched back to expose the inner fin structures (e.g., inner hardmask fin structures 14) in the trench 17c of the third section 10c. In this process, though, the oxide material 18 will remain within the trenches 17a, 17b of the sections 10a, 10b to protect the underlying hardmask fin structures 14 during subsequent etching processes. In addition, the oxide material 18 will remain on the sidewalls of the trench 17c of section 10c to protect the underlying hardmask fin structures 14 during subsequent etching processes. Following the etch back process, the exposed inner hardmask fin structures 14 of trench 17c are removed using a selective chemistry that will attack the exposed hardmask material. This etching process will form trenches 20 extending to the substrate 12.

Referring now to FIGS. 4A-4C, a material 22 is deposited within the trenches 17c, 20 using conventional deposition process, e.g., growth process. In embodiments, the material 22 can be SiCO grown on the exposed substrate material 12. Through a timed etching process, any excessive material can be removed in the trench 17c. In addition, the timed etch will result in a slight recess of the material 22. It should be understood that the timed etch will use a selective chemistry that will not attack the oxide material 18. With this noted, the oxide material 18 can also be other materials that are different than the material 22 in order to perform a maskless etching process.

In FIGS. 5A-5C, the material 18 is removed from the trenches 17a, 17b and the sidewalls of the trench 17c. As noted above, the material 18 can be removed by a selective chemistry that will not attack other exposed materials that have a different material composition. In this way, it is again possible to perform a maskless etching process.

In embodiments, the removal of the material from the trenches 17a, 17b, 17c will expose the underlying hardmask fin structures 14 in sections 10a, 10b, 10c. For example, in section 10a, the removal of the material 18 from trench 17a will expose a single hardmask fin structure 14; whereas, in sections 10b, 10c, the removal of the material from the trenches 17b, 17c will expose two hardmask fin structures 14. The exposed hardmask fin structures 14 are then removed by another selective chemistry etching process. The selective chemistry, though, will not attack the material 22 in the inner trenches 20 of section 10c.

Figures 6A, 6B, 6C:
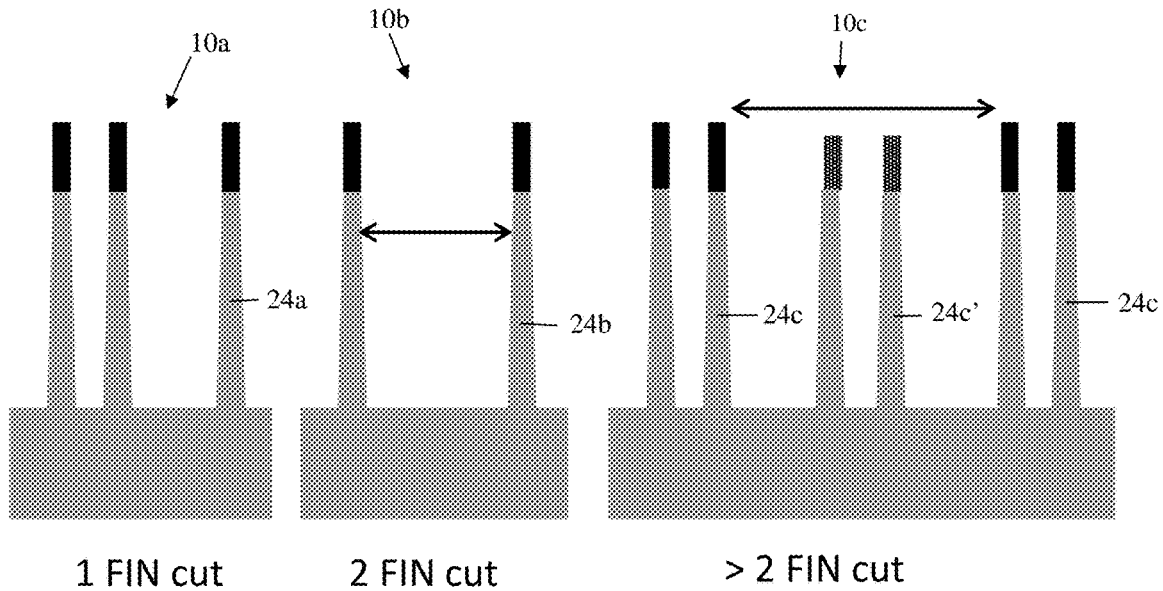
FIGS. 6A-6C show fin structures with hardmask material, amongst other features, and respective fabrication processes in accordance with aspects of the present disclosure.

As further shown in FIGS. 6A-6C, the material 16 is removed by an etch back process, amongst other processes described herein. For example, the material 16 can be removed by an OPL ashing process. Following the removal of the material 16, the substrate 12 can be patterned in a single patterning step to form fin structures 24a, 24b, 24c, 24c', with the hardmask fin structures 14 and material 22 acting as a mask during. By implementing this etching process, active fin structures 24a with a single fin cut space are formed in section 10a. In addition, active fin structures 24b with a maximum of two fin cut space are formed in section 10b. Moreover, in section 10c, active fin structures 24c and dummy fin structures 24c' are formed with a single fin cut space between the adjacent fin structures 24c and 24c'. Accordingly, by utilizing the fin structures 24c' (which will later be removed), it is now possible to avoid a fin etching process with a wide space, e.g., greater than 2 fin cuts, in section 10c. This ensures that there is a uniform density, e.g., loading, resulting in uniform profiles, e.g., side taper profile, for the fin structures in each section 10a, 10b, 10c.

Figures 7A, 7B, 7C:
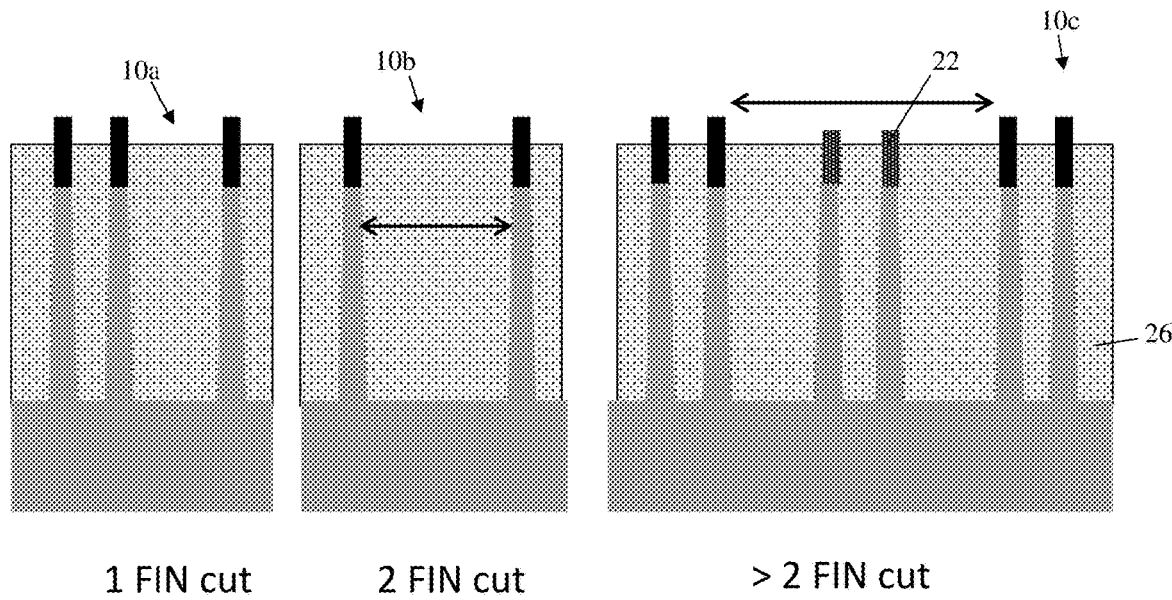
FIGS. 7A-7C show material deposited over the fin structures, amongst other features, and respective fabrication processes in accordance with aspects of the present disclosure.

In FIGS. 7A-7C, a material 26 is deposited over the fin structures 24a, 24b, 24c, 24c'. In embodiments, the material 26 can be an OPL material; although other materials are also contemplated herein. The OPL material 26 can be etched back to expose the fin structures 24a, 24b, 24c, 24c'.

Figures 8A, 8B, 8C:
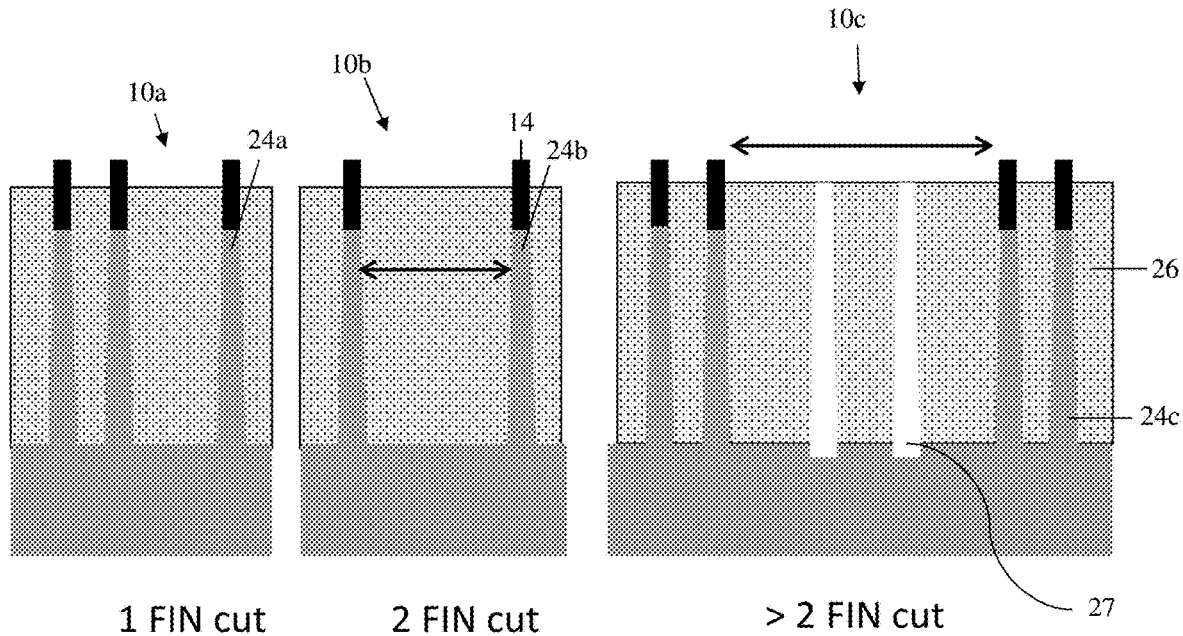

FIGS. 8A-8F show removal of the fin structures 24c' by a selective chemistry etching process that will first remove the material 22, followed by the substrate material 12 of the fin structures 24c'. In embodiments, the hardmask fin structures 14 on top of the fin structure 24a, 24b, 24c will protect the remaining fin structures 24a, 24b, 24c during this etching process. In FIGS. 8A-8C, the fin structures 24c' can be over-etched forming a recess 27 in the substrate 12; whereas, in FIGS. 8D-8F, the fin structures 24c' can be under-etched forming a slight bump 26' of substrate material 12. In embodiments, both the recess 27 and the bump 26' can be about 25 nm or less.

FIGS. 9A-9F show shallow trench isolation (STI) fill processes to form shallow trench isolation regions 28 in the structures of FIGS. 8A-8F. In embodiments, the shallow trench isolation regions 28 are formed in each of the sections 10a, 10b, 10c, between each of the fins structures 24a, 24b, 24c. The shallow trench isolation regions 28 can be formed by first removing the material 26 and then depositing an insulator material. In embodiments, the insulator material can be an oxide material that is deposited by a conventional deposition process, e.g., chemical vapor deposition (CVD). Following the deposition process, an etch back process can be performed to recess the shallow trench isolation regions 28. In addition, the hardmask material over the fin structures 24a, 24b, 24c can be removed by a selective etch chemistry.

FIGS. 10A-13F show the formation of fin structures, amongst other features, in accordance with additional aspects of the present disclosure. As previously described, the processes described with respect to FIGS. 10A-13F will result in fin structures with a uniform density, e.g., loading, resulting in uniform profiles, e.g., side taper profile, in each section 10a, 10b, 10c.

Beginning with FIGS. 10A-10C, the structure 10' includes the three sections, 10a, 10b, 10c. In this representation, the fin structures 24a, 24b, 24c, 24c' are already fabricated, and surrounded by isolation material 28. In embodiments, the in structures 24a, 24b, 24c include the hardmask fin structures 14, whereas, fin structure 24c' includes the material 22. The fin structures 24a, 24b, 24c, 24c' are fabricated (simultaneously) in the manner as described above with respect to FIGS. 1A-6C.

Figures 11A, 11B, 11C:
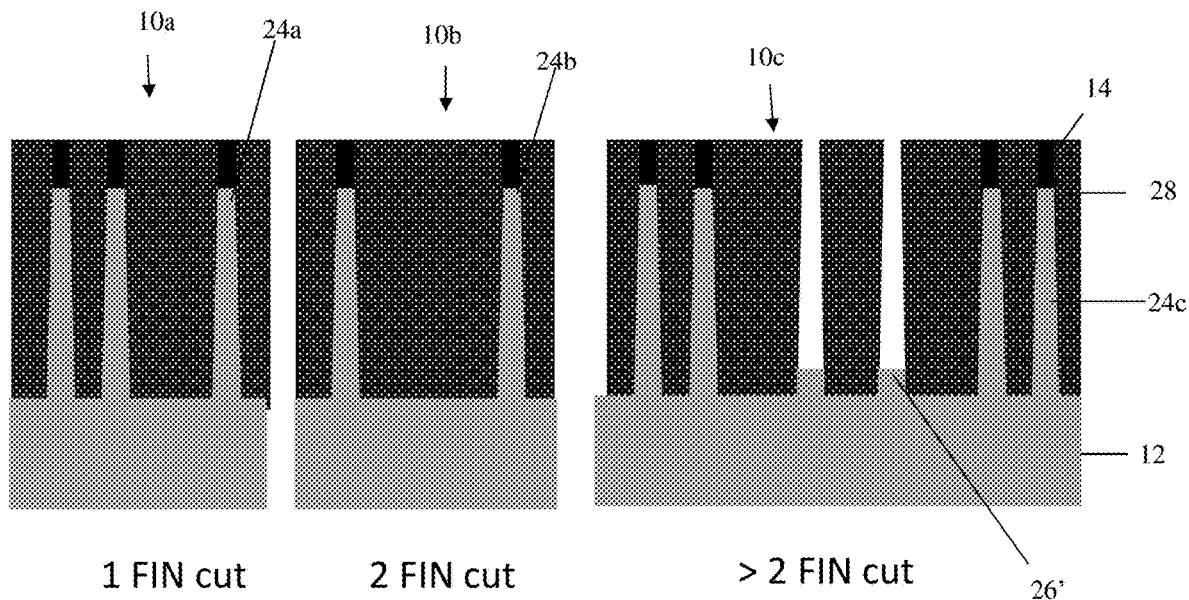
Figures 11D, 11E, 11F:
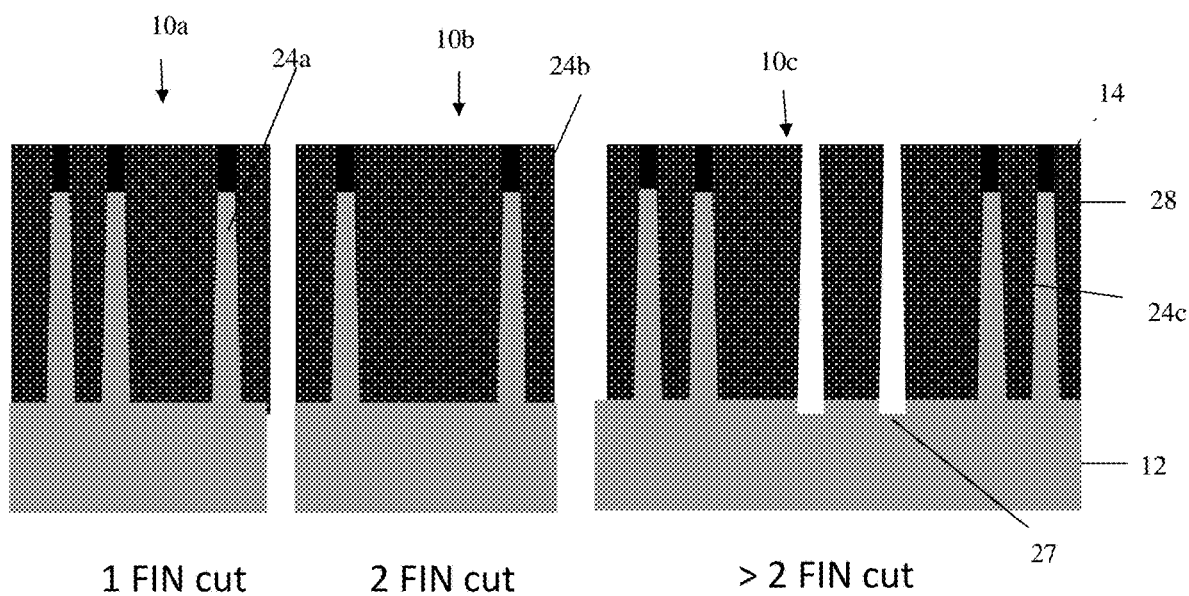

FIGS. 11A-11F show removal of the fin structures 24c' by a selective chemistry etching process that will first remove the material 22, followed by the substrate material 12 of the fin structures 24c'. In embodiments, the hardmask fin structures 14 on top of the fin structure 24a, 24b, 24c will protect the remaining fin structures 24a, 24b, 24c during this etching process. In FIGS. 11A-11C, the fin structures 24c' can be over-etched forming a recess 27 in the substrate 12; whereas, in FIGS. 11D-11F, the fin structures 24c' can be under-etched forming a slight bump 26' of substrate material 12. In embodiments, both the recess 26 and the bump 26' can be about 25 nm or less.

Figures 12A, 12B, 12C:
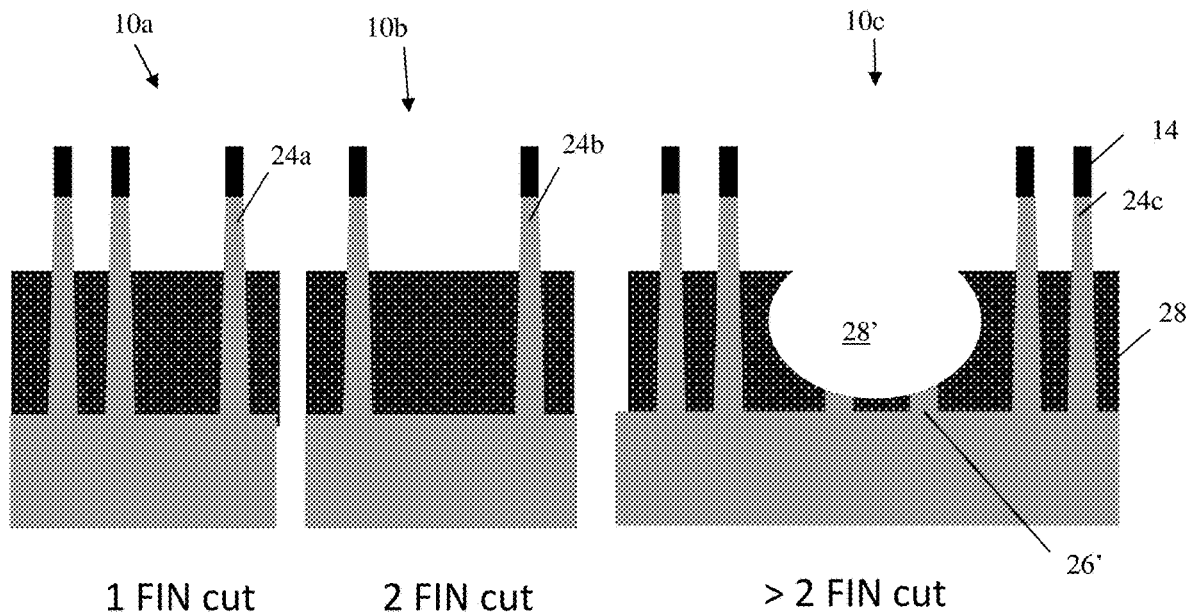
Figures 13A, 13B, 13C:
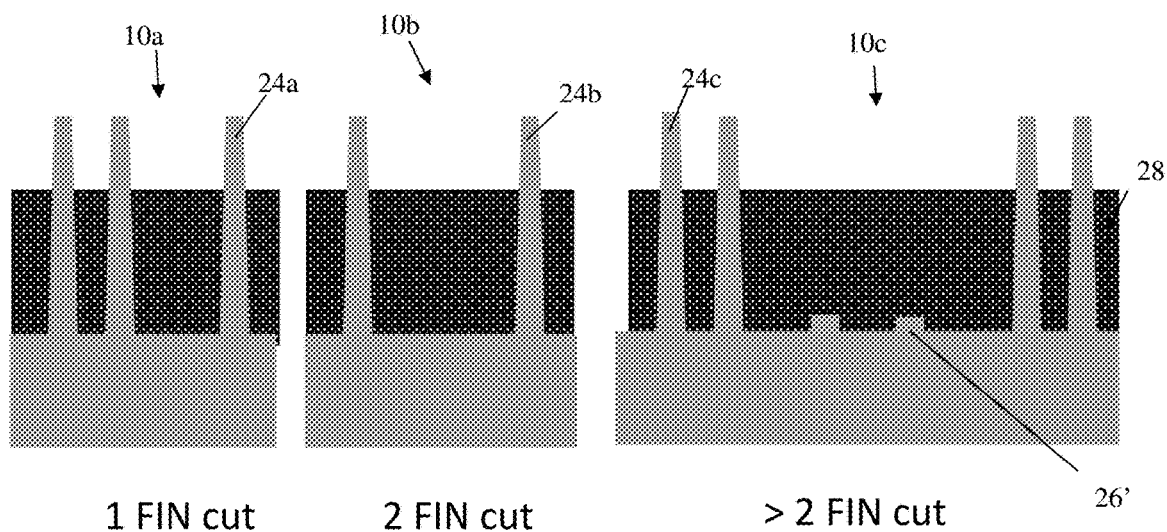
Figures 13D, 13E, 13F:
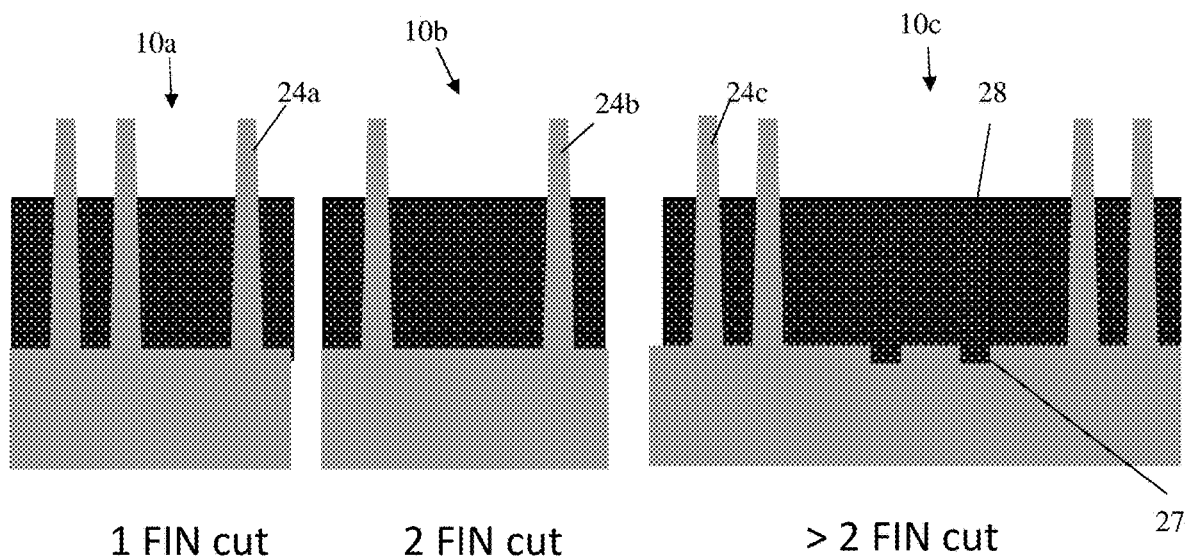
Figures 14A, 14B, 14C:
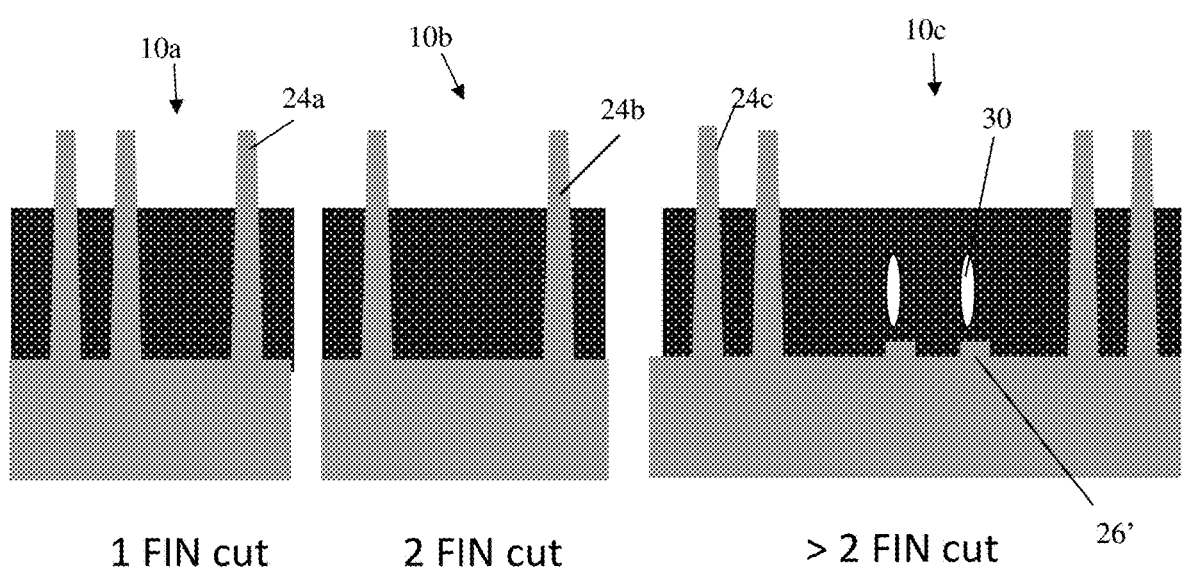
FIGS. 14A-14F show a fin structure with air gaps, amongst other features, and respective fabrication processes in accordance with additional aspects of the present disclosure.
Figures 14D, 14E, 14F:
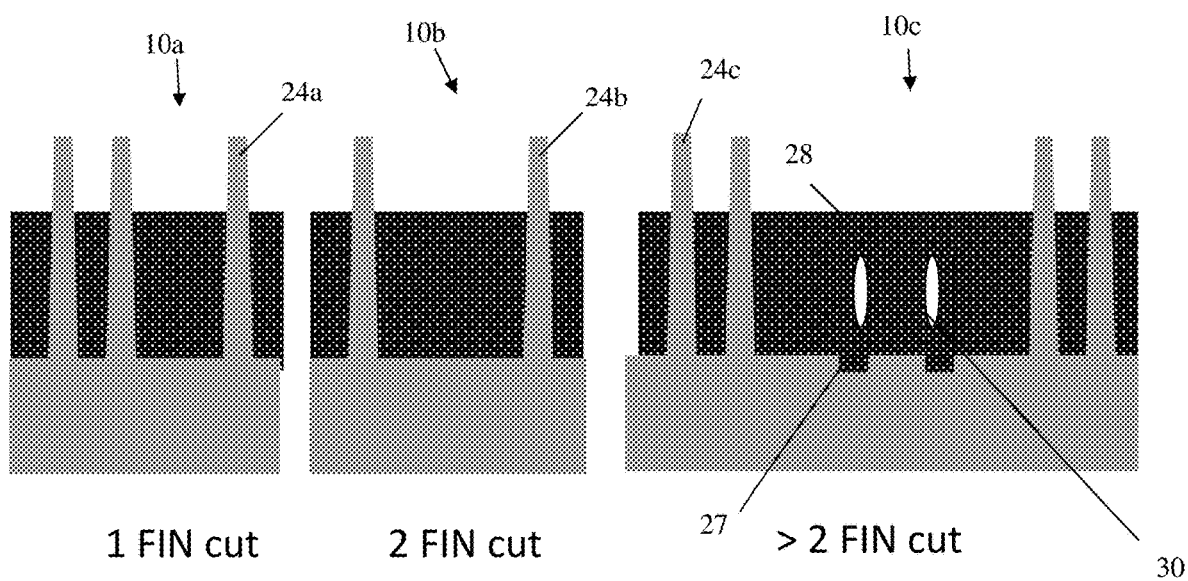

In FIGS. 12A-12C, the insulator material 28 is recessed in sections 10a, 10b, 10c, followed by an optional etch cut 28' between the fin structures 24c (at a location of the removed fin structures 24c') in section 10c. This optional etch cut is provided so that additional insulator material can be deposited without resulting in an airgap formation due to a pinch off phenomena.

FIGS. 13A-13F show deposition of additional insulator material to form the shallow trench isolation regions 28 in addition to removal of the hardmask fin structures 14 on top of the fin structure 24a, 24b, 24c, and subsequent fin reveal. In this embodiments, due to the additional etch out at region 28' of FIGS. 12A-12C, the oxide will completely fill in any spaces left by the removal of the fin structures 24c'

FIGS. 14A-14F show an embodiment with airgaps 30 between fin structures 24c in the wide fin cut. In embodiments, the airgaps 30 can be formed by the deposition of the oxide material within the empty spaces left after FIGS. 11A-11C or FIGS. 11D-11F, in addition to removal of the hardmask fin structures 14 and subsequent fin reveal. The airgaps 30 can be beneficial as it provides a perfect insulator, e.g., thereby decreasing a capacitance between the fin structures 24c adjacent to the wide fin cut space.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a plurality of fin structures in a first region of a first density of fin structures;
a plurality of fin structures in a second region of a second density of fin structures; and
a plurality of fin structures in a third region of a third density of fin structures, wherein
the first density, second density and third density of fin structures are different densities of fin structures, and the plurality of fin structures in the first region, the second region and the third region have a substantially uniform profile, each of the plurality of fin structures are separated by shallow trench isolation regions composed of dielectric material that is deposited in direct contact with side surfaces of the plurality of fin structures in the first region, the second region and the third region, wherein:
the first density of fin structures includes a single fin cut space;
the second density of fin structures includes a double fin cut space;
the third density of fin structures includes a triple or greater fin cut space;
at least one bump of substrate material is protruding above a planar surface of the substrate material and located within the triple or greater fin cut space between and separated from selected fin structures of the plurality of fin structures in the third region; and
the substrate material of the least one bump and is composed of a same material as the plurality of fin structures of the first region, the second region and the third region, and the dielectric material is directly contacting the substrate material of the bump and planar surface.

2. The structure of claim 1, wherein the substantially uniform profile is a substantially uniform side taper.

3. The structure of claim 1, wherein the first density of fin structures is greater than the second density of fin structures and the second density of fin structures is greater than the third density of fin structures.

4. The structure of claim 1, further comprising isolation regions between the plurality of fin structures in the first region, the plurality of fin structures in the second region and the plurality of fin structures in the third region.

5. The structure of claim 1, wherein the substantially uniform profile is a uniform taper on both sides of the fin structures in the first region, the second region and the third region.

6. The structure of claim 1, further comprising an airgap within the dielectric material of the shallow trench isolation region between the selected fin structures of the third region, the airgap being aligned with and over the at least one bump of substrate material.

7. A method comprising:
forming fin hardmask structures in a first region, a second region and a third region;
removing selected ones of the fin hardmask structures in the first region, the second region and the third region, with remaining hardmask fin structures covering an area of active fin structure formation;
forming a masking material covering an area of dummy fin structure formation in the third region;
patterning active fin structures using remaining fin hardmask structures as a mask in the first region, the second region and the third region, and dummy fin structures using the masking material in the third region;
removing the dummy fin structures; and
forming shallow trench isolation regions between the active fin structures.

8. The method of claim 7, wherein the active fin structures and the dummy fin structures are formed in a single patterning step.

9. The method of claim 7, wherein the dummy fin structures are between the active fin structures in the third region.

10. The method of claim 7, wherein the first region has a first density of active fin structures, the second region has a second density of active fin structures and the third region has a third density of active fin structures.

11. The method of claim 10, wherein:
- the first region is formed with a single fin cut space separating the active fin structures in the first region;
- the second region is formed with a double fin cut space separating the active fin structures in the second region; and
- the third region formed with more than a double fin cut space separating the active fin structures in the third region.

12. The method of claim 7, wherein the fin hardmask structures and the masking material are different materials, each of which have their own etch chemistry selectivity.

13. A method comprising:
- forming a plurality of hardmask fin structures in a first region, a second region and a third region of a semiconductor chip;
- forming a first masking material over the plurality of hardmask fin structures in the first region, the second region and the third region;
- forming trenches in the first masking material to expose selected hardmask fin structures of the plurality of hardmask fin structures in the first region, the second region and the third region;
- forming a second masking material in the trenches to cover the exposed selected hardmask fin structures in the first region, the second region and the third region;
- partially removing the second masking material in the third region to expose adjacent hardmask fin structures of the selected hardmask fin structures in the third region;
- removing the exposed adjacent hardmask fin structures in the third region to form spaces;
- forming a third masking material in the spaces in the third region;
- removing the second masking material in the first region and the second region and remaining portions of the second masking material in the third region to expose the selected hardmask fin structures remaining in the first region, the second region and the third region;
- removing the selected hardmask fin structures which were remaining in the first region, the second region and the third region;
- removing the first masking material and forming fin structures in the first region, the second region and the third region corresponding to the locations which include the hardmask fin structures and the third masking material; and
- removing unwanted fin structures which are masked with the third material in the third region to create a region of less density compared to the first region and the second region.

14. The method of claim 13, wherein the first masking material, the second masking material and the third masking material are different materials.

15. The method of claim 14, wherein the first masking material is an organic planarization material, the second masking material is a nitride based material and the third masking material is SiOC material.

16. The method of claim 13, wherein:
- the first region is formed with a first density of fin structures, the second region is formed with a second density of fin structures and the third region is formed with a third density of fin structures; and
- the first density is greater than the second density and the second density is greater than the third density.

17. The method of claim 16, wherein:
- the removing of the second masking material in the first region results in a single fin cut space separating adjacent fin structures in the first region;
- the removing of the second masking material in the second region results in a double fin cut space separating adjacent fin structures in the second region; and
- the removing of the remaining portions of the second masking material and the unwanted fin structures in the third region results in greater than a double fin cut space separating adjacent structures in the third region.

18. The method of claim 13, wherein the partially removing the second masking material in the third region leaves the second masking material on sidewalls of the trench in the third region, protecting the selected hardmask fin structures remaining in the third region.

19. The method of claim 13, further comprising forming shallow trench isolation regions between the fin structures formed in the first region, the second region and the third region.

\* \* \* \* \*